United States Patent [19]

Moyer

[11] Patent Number: 4,980,663
[45] Date of Patent: Dec. 25, 1990

[54] AUTOMATED ADJUSTMENT OF AIR-CORE COIL INDUCTANCE

[75] Inventor: Charles R. Moyer, Harleysville, Pa.

[73] Assignee: Ford Motor Company, Dearborn, Mich.

[21] Appl. No.: 458,035

[22] Filed: Dec. 28, 1989

[51] Int. Cl.$^5$ .......................... H03J 1/06; H01F 21/04
[52] U.S. Cl. .......................................... 334/8; 29/602.1;
29/705; 29/745; 334/71; 336/20
[58] Field of Search ....................................... 334/8-10,
334/27, 71, 74-76; 336/10, 12, 20, 225;
324/655, 656; 29/593, 602.1, 705, 745

[56] References Cited

U.S. PATENT DOCUMENTS

| | | |
|---|---|---|
| 2,252,092 | 8/1941 | Newman ........................... 334/75 X |
| 2,722,662 | 11/1955 | Tyminski . | |
| 3,648,205 | 3/1972 | Bunch et al. . | |
| 3,676,813 | 7/1972 | Renskers . | |
| 3,987,386 | 10/1976 | Valliere . | |
| 4,325,040 | 4/1982 | Whitley . | |

FOREIGN PATENT DOCUMENTS 3618122 12/1987 Fed. Rep. of Germany ........ 336/20

Primary Examiner—Paul Gensler
Attorney, Agent, or Firm—Mark Mollon; Paul K. Godwin

[57] ABSTRACT

The inductance value of air-core coils are adjusted using automated methods and inexpensive, noncomplicated apparatus. Adjusting tools are provided which displace coil turns in a linear motion with respect to the coil centerline. Specifically, the coil turns can be displaced by sliding perpendicularly to the coil centerline or by rotating a group of coils in order to modify the coil inductance. The adjusting tools used and the method of coil-turn displacement allow the automated method to reincrease the inductance of a coil in the event that displacement causes an over-decrease of inductance.

10 Claims, 3 Drawing Sheets

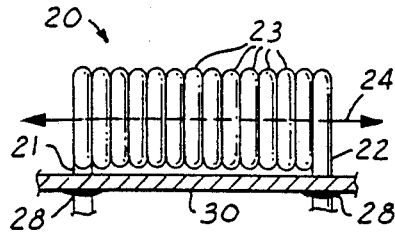
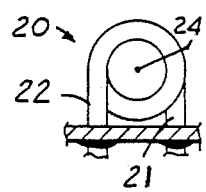
FIG.1A  FIG.1B
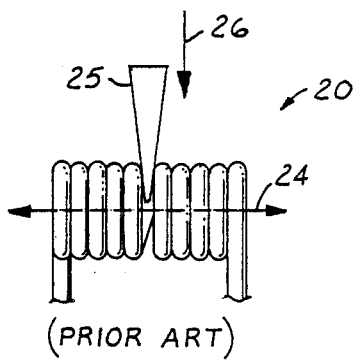
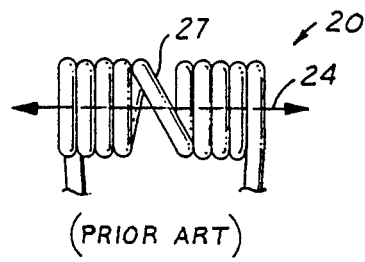
(PRIOR ART)  (PRIOR ART)
FIG.2A  FIG.2B
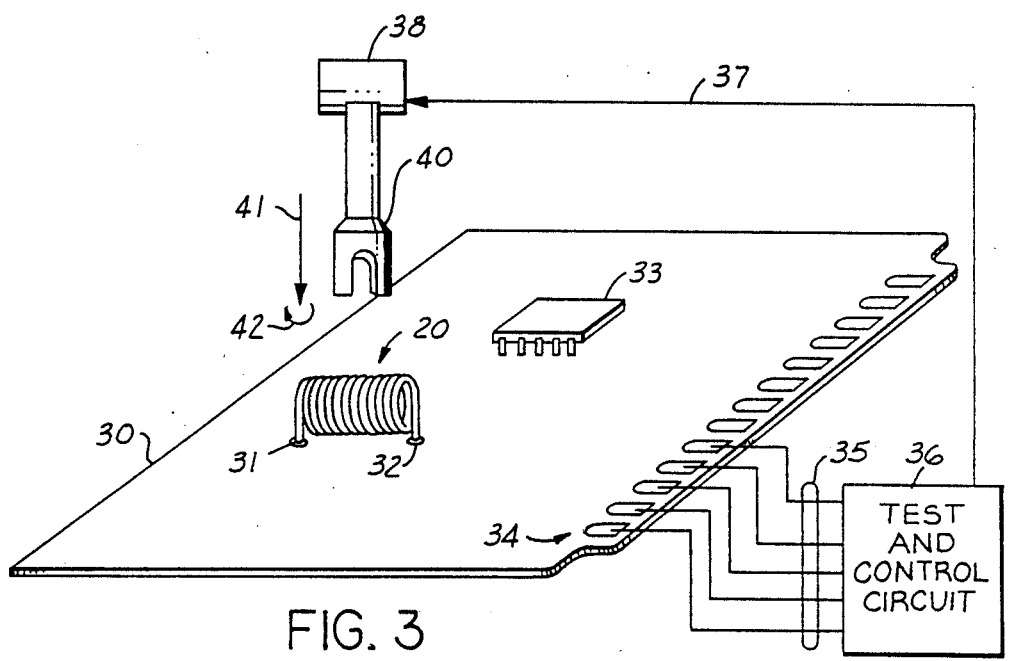
FIG. 3

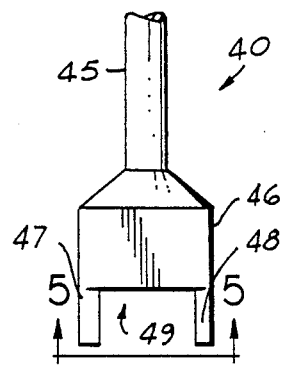
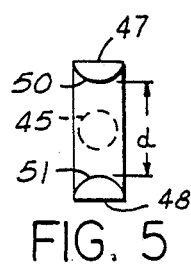
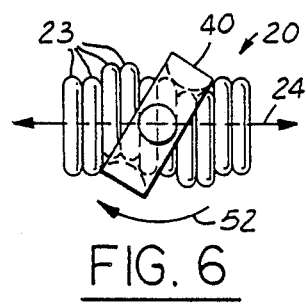
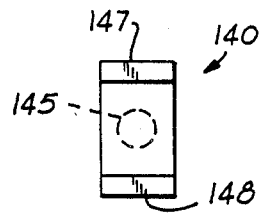
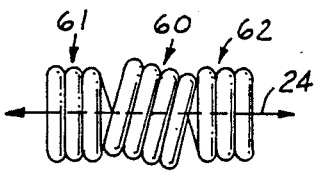
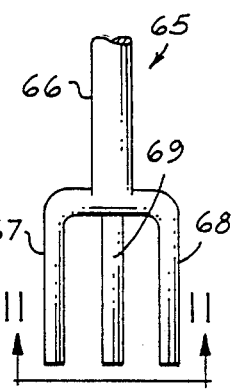
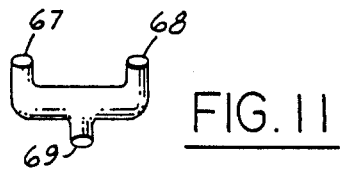
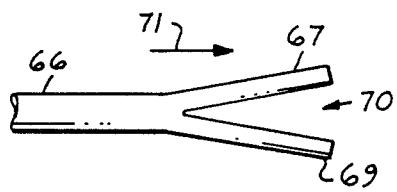
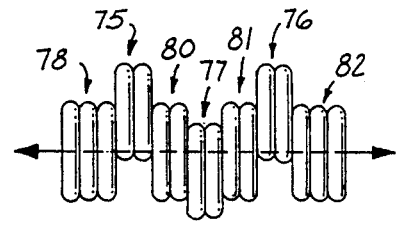

AUTOMATED ADJUSTMENT OF AIR-CORE COIL INDUCTANCE

BACKGROUND OF THE INVENTION

The present invention relates in general to adjusting the inductance of an air-core coil, and more specifically to an automated procedure for adjusting an air-core coil to achieve a desired operation in a circuit.

An air-core coil is an inductor comprised of one or more turns of wire which contains no magnetic core material inside the turns. Most typically, these coils are cylindrically shaped with circular turns (i.e., solenoidal) and contain only air in their interior. They are often used in electrical circuits to provide filters and tuned circuits.

The inductance of a solenoid-shaped coil is proportional to the volume defined by the turns and to the square of the number of turns per unit length. Therefore, it is possible to construct an air-core coil having an inductance approximately equal to a desired design inductance.

Air-core coils usually provide a fixed value of inductance in a circuit. However, it is known to alter the shape of an air-core coil to precisely "tune" a coil whereby the coil inductance can precisely match a desired value of inductance. For example, U.S. Pat. No. 2,722,662, issued to Tyminski, discloses an air-core coil wherein the coil can be adjusted either by compressing or expanding the spacing between coil windings or by bending the coil at an angle by as much as 180° to decrease the coil inductance.

It is well known that manufacturing costs can often be decreased by employing automated manufacturing techniques. In fabricating large numbers of electrical circuits, such as ones using a printed wiring board, the use of automated manufacturing, adjustment and testing techniques is desirable. However, prior art adjustment techniques for air-core coils are not suitable for automated adjustment. For example, adjustment of coil inductance to both higher or lower values by compression or expansion of the coil length would require complicated mechanisms.

SUMMARY OF THE INVENTION

It is a principal object of the present invention to provide an automated method for adjusting the inductance of an air-core coil wherein the coil inductance can be initially decreased and can also be subsequently increased in case of an over-decrease during adjustment.

It is another object of the present invention to provide apparatus for altering the shape of an air-core coil whereby the coil inductance is adjusted using robotic automation.

These and other objects are achieved according to the method of the present invention for adjusting the inductance of an air-core coil.

A helically wound air-core coil having a plurality of turns and an imaginary straight centerline passing through the interior of each of the turns is secured in a fixed location. According to the invention, at least one but less than all of the turns are displaced in a linear motion with respect to the centerline in order to modify the inductance of the coil. The linear motion as herein defined may comprise sliding individual turns in a direction substantially perpendicular to the centerline or may comprise rotating a group of turns about an axis perpendicularly intersecting the centerline.

Preferably, the air-core coil is secured to a printed wiring board. The air-core coil is energized with an excitation current, and an output parameter of the coil is measured. The measured output parameter is compared with a predetermined output parameter corresponding to a desired tuning of the coil. The automated adjustment tool contacts the coil to modify the shape of the coil and to displace the coil turns until the measured output parameter is substantially equal to the predetermined output parameter.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings, in which:

FIG. 1A is a side view of an unaltered air-core coil to which the adjustment method of the present invention is applied.

FIG. 1B is an end view of the coil of FIG. 1A.

FIG. 2A is a side view of a coil during adjustment according to a prior art knifing method.

FIG. 2B is a side view of the coil after adjustment performed according to FIG. 2A.

FIG. 3 is a schematic representation of an adjustment system according to the present invention.

FIG. 4 is a side view of an adjustment tool according to the present invention.

FIG. 5 is an end view of the tool of FIG. 4 seen along line 5—5.

FIG. 6 is a top view showing the adjustment tool of the present invention in contact with a coil during adjustment.

FIG. 7 is a top view of the coil of FIG. 6 after adjustment and withdrawal of the adjusting tool.

FIG. 8 is an end view of an adjusting tool according to a further embodiment of the invention.

FIG. 9 is a top view of another coil after adjustment using the adjusting tool of FIG. 8.

FIG. 10 is a side view of an adjusting tool according to an alternative embodiment of the invention.

FIG. 11 is an end view of the adjusting tool of FIG. 10 viewed along line 11—11.

FIG. 12 is a side view of the tool of FIG. 10 viewed at 90° from the line of sight of FIG. 9.

FIG. 13 is a top view of a coil after adjustment using the adjusting tool of FIG. 10.

DETAILED DESCRIPTION OF PREFERRED EMBODIMENTS

Figure 14:
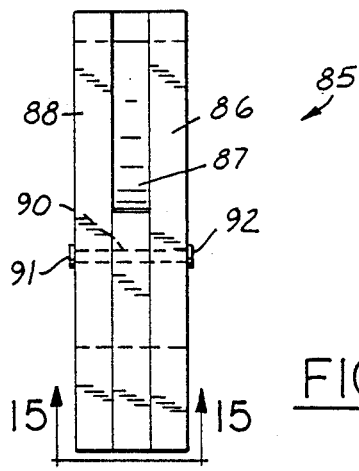
FIG. 14 is a side view of an adjusting tool according to another alternative embodiment of the invention.

Turning now to FIG. 1A, an air-core coil 20 has a first lead 21 and a second lead 22. Between leads 21 and 22 are a plurality of turns 23 circumferentially wound around a longitudinal centerline 24. As shown in the end view of FIG. 1B, turns 23 are circular although other shapes could be employed, such as ovals. However, the cylindrical solenoidal shape is most common. Adjustment of a coil 20 typically takes place after attachment to a printed wiring board 30 by solder 28.

FIGS. 2A and 2B illustrate the prior art knifing method for adjusting the inductance of an air-core coil. In FIG. 2A, a knife 25 is inserted between a pair of turns along the direction of an arrow 26. The widening width of knife 25 causes the air-core coil to expand resulting in an altered turn 27, as shown in FIG. 2B. Moving the coil turns with respect to one another changes their mutual inductance and thereby the total inductance of the coil. By expanding the coil using the knifing method, the total inductance of the coil decreases since the total length increases. However, in the event of an over-decrease in the coil inductance, the knifing method is unable to recompress the coil to thereby increase the coil inductance. Furthermore, the knifing method is not well suited to an automated implementation because of the difficulty of locating the knife tip accurately between turns of the coil.

FIG. 3 illustrates an improved inductance adjustment according to the present invention. Air-core coil 20 is attached to a printed wiring board 30 at throughholes 31 and 32 by soldering, for example. Printed wiring board 30 may contain other components, such as an integrated circuit 33, and may be part of an electronic circuit such as a radio receiver. A plurality of edge-connector pads 34 are shown on printed wiring board 30, although external connections could alternatively be made using circuit terminals or test points.

A test and control circuit 36 is connected to edge-connector pads 34 via a plurality of lines 35. A line 37 connects test and control circuit 36 to an automated servomechanism 38 which controls movement of an adjusting tool 40 including at least longitudinal movement as shown by an arrow 41 and rotational movement as shown by an arrow 42. In a first embodiment, adjusting tool 40 is fork-shaped with a pair of prongs adapted to be located on opposite sides of coil 20. In operation, test and control circuit 36 energizes circuitry on printed wiring board 30 including coil 20 and monitors an output of the circuit which depends on the value of inductance of coil 20. For example, where the circuit on printed wiring board 30 comprises a radio tuner, a radio output can be measured in a peaking operation such that a tuned circuit including the coil 20 is adjusted to maximize the radio output. Test and control circuit 36 communicates with servomechanism 38 over line 37 to cause tool 40 to extend in the direction of arrow 41 such that coil 20 becomes located between the prongs of adjusting tool 40. Preferably, coil 20 is selected to have an unmodified inductance value greater than the expected value corresponding to maximum radio performance. Test and control circuit 36 monitors the radio output as it commands servomechanism 38 to rotate adjusting tool 40, as shown by arrow 42. As adjusting tool 40 rotates, the radio output being monitored in the peaking operation by test and control circuit 36 increases as the inductance value of coil 20 decreases toward its optimum value. Rather than a peaking operation, a nulling or a minimizing operation could also be employed depending on the function performed by the actual circuit being tested. Test and control circuit 36 monitors the changing inductance until the radio output passes its peak value and begins to decrease, indicating that the coil inductance value has been over-decreased. Subsequently, test and control circuit 36 commands servomechanism 38 to rotate in the opposite direction to the point where the radio output was at its maximum. Alternatively, the radio output parameter could be compared to some predetermined value which indicates an acceptable radio performance (e.g., an output parameter is desired to be either above or below the predetermined value), and adjustment is discontinued when that predetermined value is reached rather than attempting to obtain the absolute maximum. After adjustment, adjusting tool 40 is withdrawn by test and control circuit 36 (some backing off of the rotation of tool 40 may be needed prior to withdrawing it).

As shown in FIG. 4, adjusting tool 40 includes a rod 45 connected to a fork end 46. A prong 47 and a prong 48 on fork end 46 are separated to receive the air coil to be adjusted in a coil receiving space 49.

FIG. 5 provides an end view of adjusting tool 40 as indicated by lines 5—5 in FIG. 4. Prongs 47 and 48 have coil contacting surfaces 50 and 51, respectively, which are curved in order to provide point contact with the individual turns of the coil being adjusted.

FIG. 6 is a top view showing the effect on coil 20 of rotation of adjusting tool 40 in the direction of arrow 52. Individual turns of coil 20 are displaced in a direction substantially perpendicular to centerline 24 of coil 20. The displacement of individual turns reduces the inductance of coil 20 by increasing the effective area of the coil. In case of an over-decrease in inductance, adjusting tool 40 can be rotated in the direction opposite arrow 52 in order to displace the individual turns back toward centerline 24. By virtue of the curved surface of prongs 47 and 48, adjusting tool 40 can contact the far ends of the displaced turns in order to displace them in the direction opposite to their original displacement.

FIG. 7 illustrates the resulting air-core coil shape after adjustment according to FIG. 6. A first group of coils 55 is displaced in a first direction away from centerline 24. A second group of turns 56 is displaced in a direction opposite the displacement of group 55. Groups of turns 57, 58 and 59 remain substantially in their original position, centered on centerline 24.

The coil shape of FIG. 7 results when adjusting tool 40 has prongs 47 and 48 separated by a distance d (shown in FIG. 5) which is somewhat larger than the outside diameter of the individual turns in coil 20. In contrast, use of an adjusting tool 140 shown in FIG. 8 that has prongs separated by a distance only slightly greater than the outside diameter of individual turns and having straight interior edges on prongs 147 and 148 results in a modified coil shape as shown in FIG. 9. A group of turns 60 is rotated about an axis perpendicularly intersecting centerline 24 since the axis of tool shaft 145 is perpendicular to centerline 24. The group of turns 60 has an axis which is inclined to centerline 24. Groups of turns 61 and 62 remain in substantially their original location.

Another alternative embodiment of the present invention employs an adjusting tool 65, as shown in FIG. 10. A rod 66 supports three adjustment tool prongs 67, 68 and 69. As shown in the end view of FIG. 11, prongs 67 and 68 are upper prongs, and prong 69 is a lower prong (three or more prongs can be used as long as at least one prong is disposed on each side of the coil). As shown in FIG. 12, a coil receiving space 70 is defined between upper prongs 67 and 68 and lower prong 69. Coil receiving space 70 narrows toward an inner termination at rod 66.

When substituted into the apparatus of FIG. 3, adjusting tool 65 is advanced toward the air-core coil being adjusted. Individual turns of the coil are displaced when contacted by prongs 67, 68 and 69 by an amount proportional to the distance along the line 71 in FIG. 12 that adjusting tool 65 is advanced.

FIG. 13 shows a coil 20 after adjustment according to this alternative embodiment. A group of turns 75 and a group of turns 76 are displaced in a first direction away from centerline 24. Another group of turns 77 is displaced in the opposite direction from centerline 24. Groups of turns 78, 80, 81 and 82 remain substantially in their original position. The displaced turns decrease the total coil inductance by increasing the effective coil area. In case of an over-decrease, adjusting tool 65 can be withdrawn, rotated 180°, and readvanced in order to realign the displaced coils by the required amount.

Figure 15:
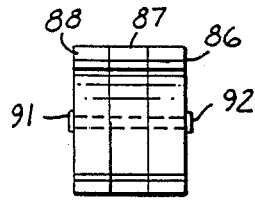
FIG. 15 is as end view of the adjusting tool of FIG. 14 viewed along line 15—15.

In still another embodiment of the invention, the adjusting tool of FIG. 14 has three pivotable sections 86, 87, and 88. Sections 86–88 are rotatably secured by a pivot pin 90 having heads 91 and 92. As shown in FIG. 15, each section 86–88 has a coil contacting end in the form of a U-shaped fork similar to the tools shown in FIGS. 5 and 8.

Figure 16:
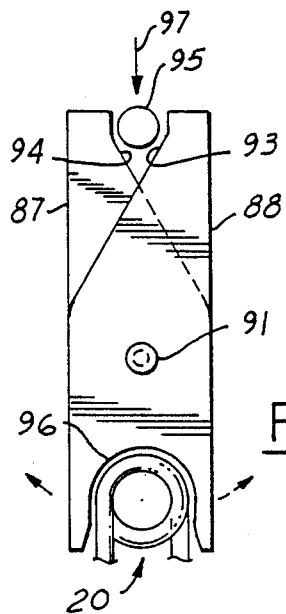
FIG. 16 is another side view of the adjusting tool of FIG. 14.

The side view of FIG. 16 illustrates alternating cam follower surfaces 93 and 94 of sections 88 and 87, respectively. The movement of a rod-shaped cam 95 downward in the direction of arrow 97 causes cam 95 to contact cam follower surfaces 93 and 94, thereby causing sections 88 and 87 (and section 86, not shown) to rotate about pivot pin 91. Each section 86, 87, and 88 contacts some of the turns of coil 20 and causes their linear displacement by sliding them perpendicularly to the coil centerline. In the present embodiment, sections 86 and 88 move their respective turns in one direction and section 87 moves its respective turns in the opposite direction. In case of an over-decrease in coil inductance, cam 95 is withdrawn in the direction opposite arrow 97. Sections 86–88 preferably tend to return to their aligned positions through provision of a spring mechanism, for example. As cam 95 is withdrawn, sections 86–88 restore the coil turns toward their original locations in proportion to the movement of cam 95.

Figure 17:
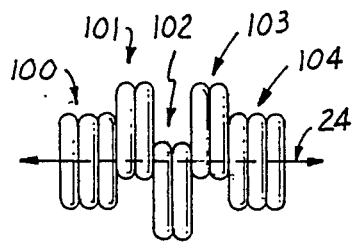
FIG. 17 is a top view of a coil after adjustment using the adjusting tool of FIG. 14.

FIG. 17 shows a coil shape resulting from adjustment using adjustment tool 85 of FIG. 14. Groups of turns 100 and 104 are in substantially their original positions. Groups of turns 101 and 103 are displaced in a first direction from centerline 24. Group of turns 102 is displaced in a direction opposite the first direction.

The foregoing invention has been practiced using commercially available air-core coils constructed of soft copper having a varnish insulation, for example. Such commercially available coils have been found to provide acceptable flexibility to be easily adjusted with the coils secured to a printed wiring board and to provide acceptable structural integrity to maintain their modified shapes. Automated inductance adjustment has been achieved thereby improving adjustment accuracy and reducing costs.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. A method of adjusting the inductance of an air-core coil comprising the steps of:
   securing in a fixed location a helically wound air-core coil having a plurality of turns and a longitudinal centerline passing through the interior of each of said turns;
   providing a multi-pronged tool;
   locating at least two prongs of said multi-pronged tool on opposite sides of said coil; and
   rotating said tool to contact at least one of said turns to displace at least one but less than all of said turns in a linear motion with respect to said centerline in order to modify the inductance of said coil.

2. A method of adjusting the inductance of an air-core coil comprising the steps of:
   securing in a fixed location a helically wound air-core coil having a plurality of turns and a longitudinal centerline passing through the interior of each of said turns; and
   displacing at least one but less than all of said turns in a linear motion with respect to said centerline in order to modify the inductance of said coil, wherein said linear motion comprises sliding individual turns in a direction substantially perpendicular to said centerline, and wherein at least one turn is displaced in a first direction and at least one other turn is displaced in a direction opposite said first direction.

3. A method of adjusting the inductance of an air-core coil comprising the steps of:
   securing in a fixed location a helically wound air-core coil having a plurality of turns and a longitudinal centerline passing through the interior of each of said turns;
   locating at least two prongs of a multi-pronged tool on one side of said coil and another prong of said tool on the opposite side of said coil; and
   advancing said tool perpendicularly to said centerline in order to contact a plurality of said turns to displace at least one but less than all of said turns in a linear motion with respect to said centerline in order to modify the inductance of said coil, wherein said linear motion comprises sliding individual turns in a direction substantially perpendicular to said centerline, and wherein at least one turn is displaced in a first direction and at least one other turn not adjacent to said one turn is displaced in said first direction.

4. A method of adjusting the inductance of an air-core coil comprising the steps of:
   securing the ends of a helically wound air-core coil in a relatively fixed position, said coil having a plurality of turns and a longitudinal centerline passing through the interior of each of said turns;
   energizing said coil with an excitation current;
   measuring an output parameter of said coil;
   comparing said measured output parameter with a predetermined criteria corresponding to a desired tuning of said coil;
   contacting said coil with a tool adapted to modify the shape of said coil; and
   controlling said tool in response to said comparison to displace at least one but less than all of said turns in a linear motion with respect to said centerline until said measured output parameter satisfies said predetermined criteria.

5. The method of claim 4 wherein said predetermined criteria is to maximize said measured output parameter.

6. The method of claim 4 wherein said predetermined criteria is a comparison of said measured output parameter with a predetermined output parameter.

7. An air-core coil having a plurality of turns wound around a straight centerline, said coil comprising:
   a first group of turns within said plurality of turns, each turn of said first group having said center line substantially at its center;
   a second group of turns within said plurality of turns, each turn of said second group being displaced relative to said centerline in a first direction perpendicular to said centerline; and
   a third group of turns within said plurality of turns, each turn of said third group being displaced relative to said centerline.

8. The coil of claim 7 wherein said third group of turns is displaced relative to said centerline in a second direction opposite to said first direction.

9. The coil of claim 7 wherein said second and third groups of turns are displaced from said centerline in substantially the same direction and wherein said second and third groups of turns are separated by turns from said first group of turns.

10. An automated coil adjustment system comprising:
   test and control means adapted to be connected to a circuit containing an air-core coil to be adjusted for determining a coil modification needed to achieve a desired operation in said circuit;
   adjusting tool means for contacting said air-core coil to be adjusted and for displacing at least one but less than all of the turns of said coil in a linear motion with respect to the centerline of said coil in order to modify the inductance of said coil; and
   servomechanism means coupled to said test and control means and to said adjusting tool means for moving said adjustment tool means according to said coil modification determined by said test and control means.

* * * * *